(12) United States Patent
Yoshikawa

(10) Patent No.: US 8,649,751 B2
(45) Date of Patent: Feb. 11, 2014

(54) RECEIVER

(75) Inventor: Naoto Yoshikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 448 days.

(21) Appl. No.: 12/801,035

(22) Filed: May 18, 2010

(65) Prior Publication Data

US 2010/0301941 A1 Dec. 2, 2010

(30) Foreign Application Priority Data

Jun. 1, 2009 (JP) ................................. 2009-131849

(51) Int. Cl.
*H04B 7/00* (2006.01)

(52) U.S. Cl.
USPC .......... 455/234.1; 455/232.1; 455/240.1; 455/298; 455/341; 341/139; 330/51; 330/311

(58) Field of Classification Search
USPC ........... 455/341, 234.1, 232.1, 240.1; 330/51, 330/311; 341/139
See application file for complete search history.

(56) References Cited

U.S. PATENT DOCUMENTS

| | | | |
|---|---|---|---|
| 7,474,158 B1 * | 1/2009 | Yim et al. | 330/311 |
| 7,911,269 B2 * | 3/2011 | Yang et al. | 330/51 |
| 2003/0025623 A1 * | 2/2003 | Brueske et al. | 341/139 |
| 2009/0075623 A1 * | 3/2009 | Lee et al. | 455/341 |

FOREIGN PATENT DOCUMENTS

JP 2008-017058 A 1/2008

* cited by examiner

*Primary Examiner* — Junpeng Chen
(74) *Attorney, Agent, or Firm* — Sony Corporation

(57) ABSTRACT

Disclosed herein is a receiver, including: an amplifier for amplifying a received signal; a strain compensator for having a function of compensating for a strain generated in an output signal from the amplifier in accordance with a stain compensation amount which is controlled based on a bias signal from the output signal from the amplifier; and a stain compensation amount controlling portion for generating the bias signal and outputting the bias signal to the strain compensator so that the strain compensation is carried out with a compensation amount corresponding to a strength of the received signal.

10 Claims, 8 Drawing Sheets

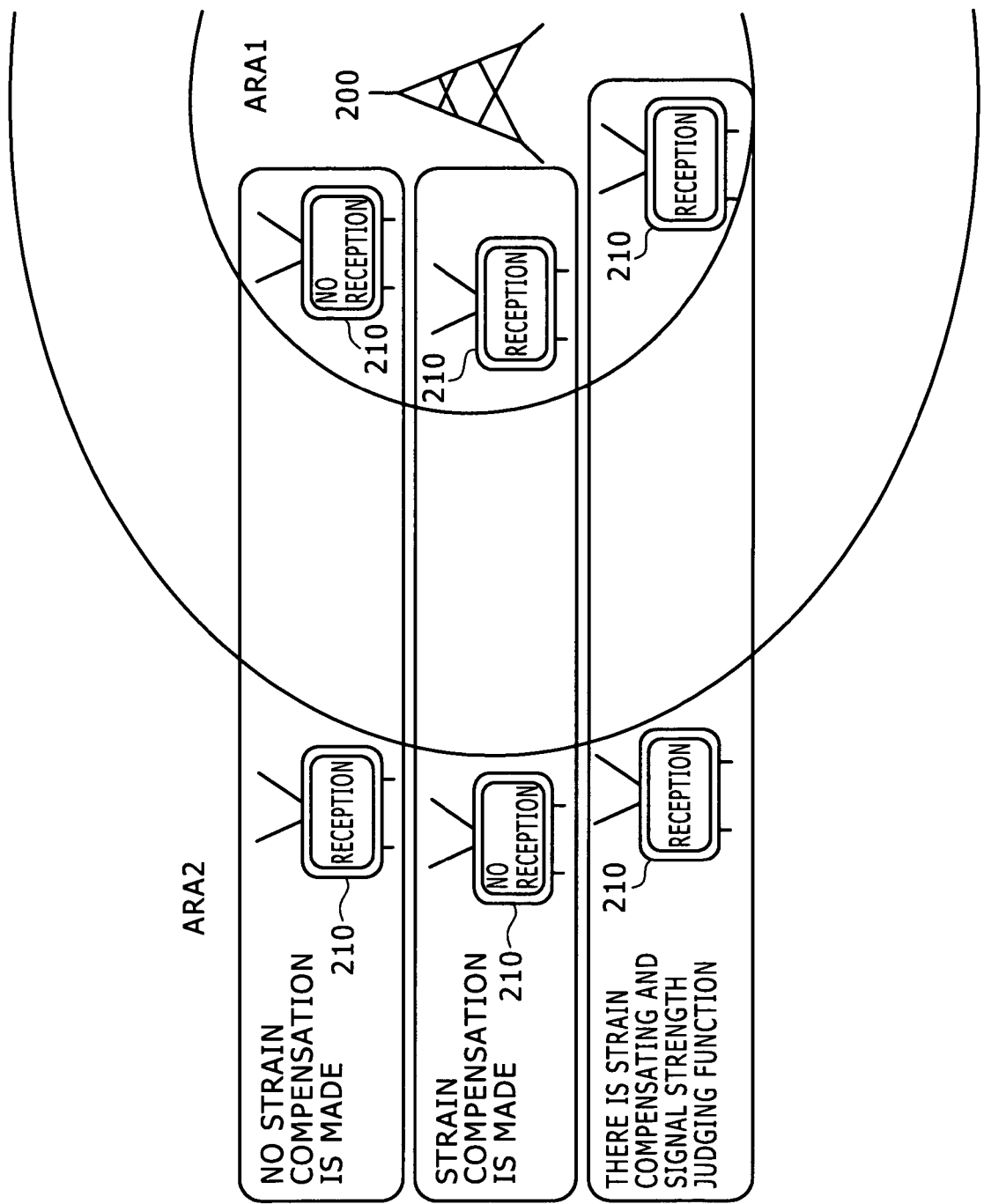

RECEIVER

BACKGROUND OF THE INVENTION

1. Field of the Invention

The present invention relates to a receiver such as a wireless communication apparatus, for example, including a low-noise amplifier which can be applied to a television tuner or the like.

2. Description of the Related Art

A low-noise amplifier is used in a wireless receiver typified by a television tuner.

Japanese Patent Laid-Open. No. 2008-17058 discloses a strain compensating circuit used for linearization of a low-noise amplifier or the like.

FIG. 1 is a circuit diagram showing an example of a configuration with which a differential amplifier composing a low-noise amplifier, and a strain compensating function are both realized.

As shown in FIG. 1, the low-noise amplifier 1 includes n-channel MOS (NMOS) transistors NT1 and NT2 composing a differential pair transistor 11, and a current source 12.

A strain compensator 2 includes NMOS transistors NT3 and NT4 composing a differential pair transistor 21, and a current source 22.

Hereinafter, the principles of an operation of the circuit shown in FIG. 1 will be described.

In the differential pair composed of two MOS transistors each as an insulated gate field-effect transistor conforming to square characteristics, under a constant input amplitude, a relationship among an amplitude IM3 of a three-order strain component, an over-drive voltage (Vgs−Vth), and a transistor size, W, is expressed by Expression (1):

$$IM3 \propto \alpha \frac{W}{(Vgs - Vth)} \quad (1)$$

where α is a proportionality coefficient peculiar to a device process.

With regard to a strain compensation establishment condition, the amplitude IM3 of the three-order strain component generated by the strain compensator 2 is identical to that IM3 of the three-order component generated by the low-noise amplifier 1. Therefore, when a ratio of a transistor size of the strain compensator 2 to a transistor size of the low-noise amplifier 1 is set at 1:M from Expression (1), the following relational expression (Expression (2)) is established between the current ratios:

$$Ic = Id \times M^3 \quad (2)$$

where Id is a consumption current in the compensating circuit, and Ic is a consumption current in the low-noise amplifier.

Also, a total gain in the compensation establishment state is reduced as expressed by Expression (3) in terms of a circuit configuration:

$$G\left(1 - \sqrt{\frac{1}{M^5}}\right) \quad (3)$$

where G is a gain in a phase of ratio compensation.

SUMMARY OF THE INVENTION

It is a problem inherent in the circuit shown in FIG. 1 that since the device noise generated is increased by using the strain compensation 2, while the gain is reduced in accordance with Expression (3), the noise factor characteristics are deteriorated by carrying out the strain compensation.

In addition, seemingly, it seems from Expression (3) as if the reduction of the gain can be avoided by minimizing the numerical value M.

However, when such a condition is realized in the actual circuit, as apparent from Expression (2), the over-drive voltage is largely different between the strain compensator 2 and the low-noise amplifier 1. Thus, a lower limit of the numerical value M is limited by the process dispersion, the temperature characteristics or the frequency characteristics. As a result, it may be impossible to avoid the deterioration of the noise factor characteristics.

The present invention has been made in order to solve the problems described above, and it is therefore desirable to provide a receiver in which strain compensation can be exactly carried out while deterioration of noise factor characteristics is suppressed, and thus a dynamic range of the receiver can be enhanced.

In order to attain the desire described above, according to an embodiment of the present invention, there is provided a receiver including: an amplifier for amplifying a received signal; a strain compensator for having a function of compensating for a strain generated in an output signal from the amplifier in accordance with a stain compensation amount which is controlled based on a bias signal from the output signal from the amplifier; and a stain compensation amount controlling portion for generating the bias signal and outputting the bias signal to the strain compensator so that the strain compensation is carried out with a compensation amount corresponding to a strength of the received signal.

As set forth hereinabove, according to the present invention, the strain compensation can be exactly carried out while the deterioration of the noise factor characteristics is suppressed, and therefore the dynamic range of the receiver can be enhanced.

BRIEF DESCRIPTION OF THE DRAWINGS

FIGS. 8A to 8C are respectively schematic views explaining an effect when the present invention is applied to the case where a television broadcast wave is received at the receiver shown in FIG. 2.

DETAILED DESCRIPTION OF THE PREFERRED EMBODIMENT

The preferred embodiment of the present invention will be described in detail hereinafter with reference to the accompanying drawings.

It is noted that the description will be given below in accordance with the following order.

1. Entire Configuration of Receiver
2. Concrete Configuration of Strain Compensation System

1. Entire Configuration of Receiver

Figure 1:
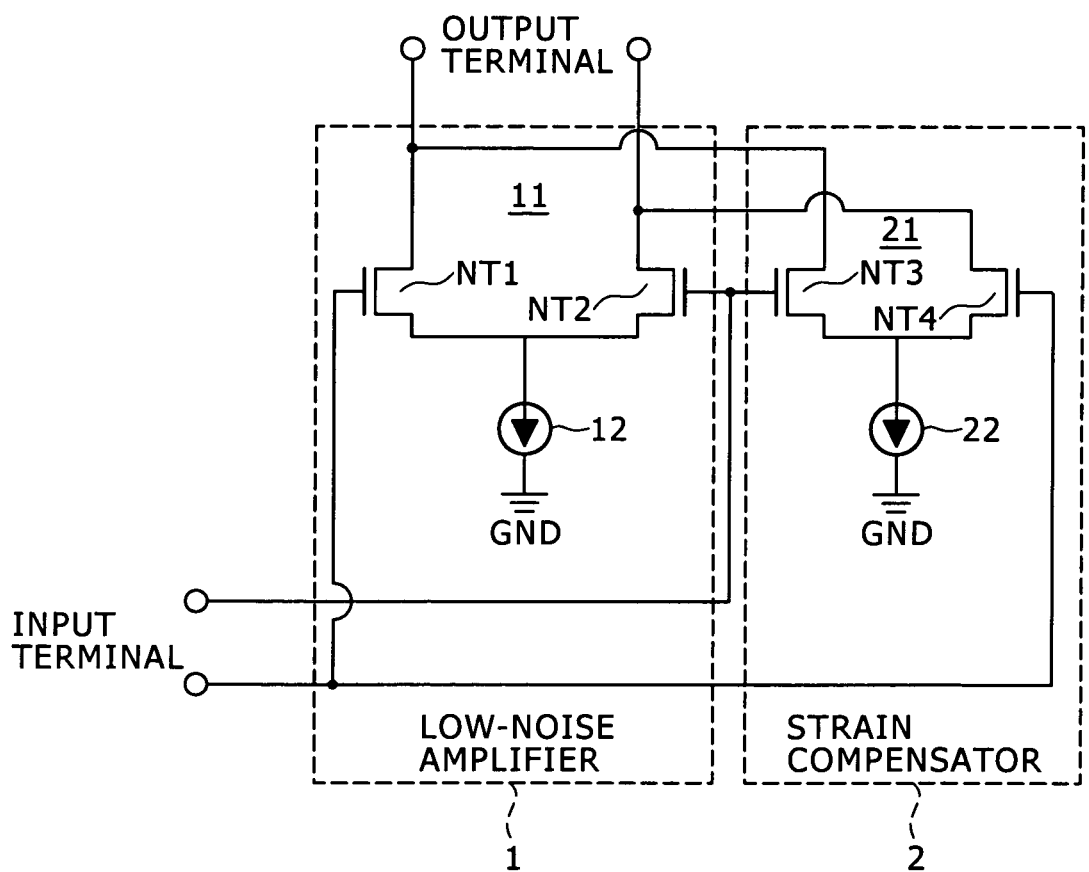
FIG. 1 is a schematic circuit diagram showing an example of a configuration of a circuit in which a differential amplifier composing a low-noise amplifier, and a strain compensating function are both realized.
Figure 2:
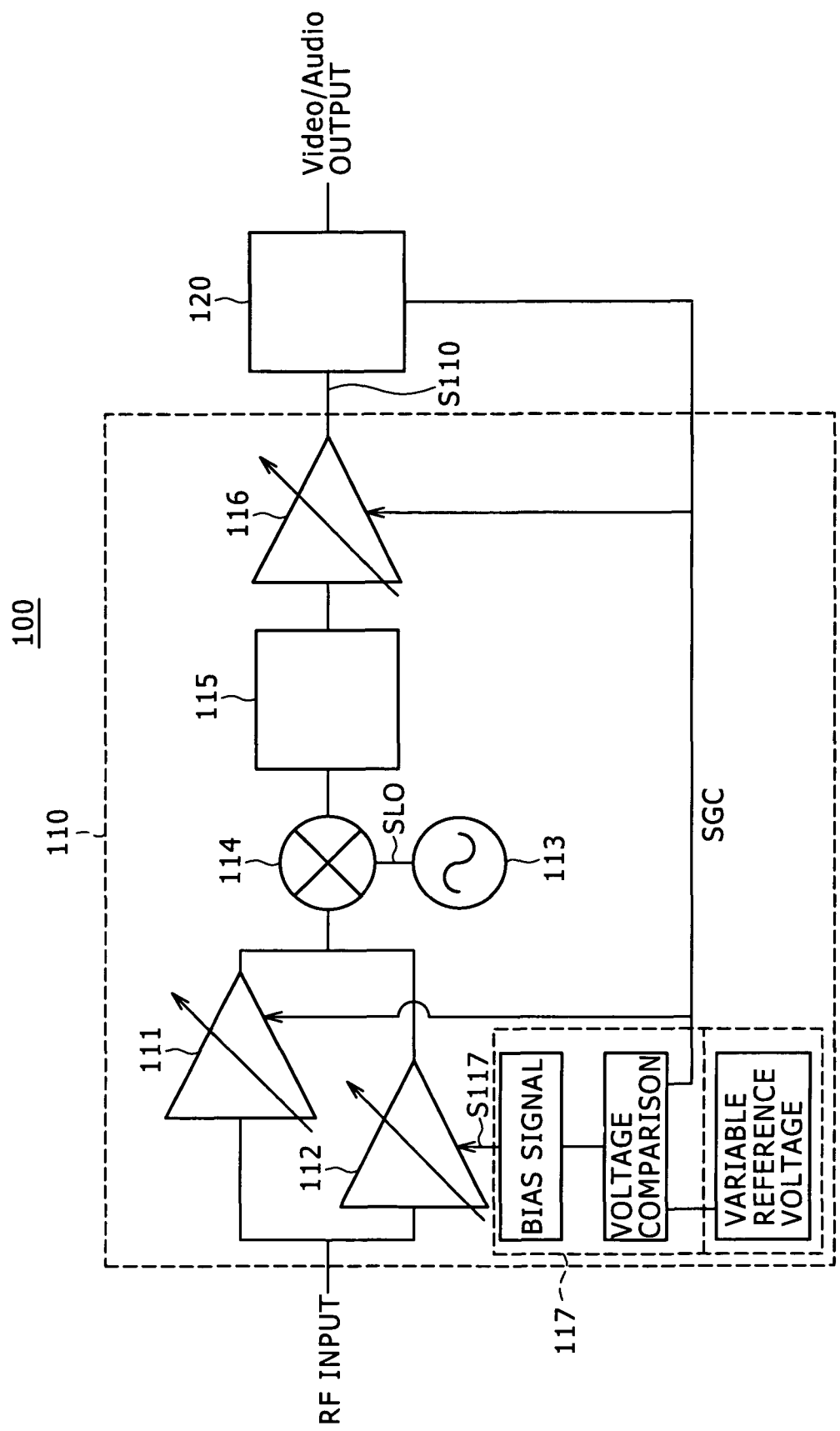
FIG. 2 is a circuit diagram, partly in block, showing a configuration of a receiver according to an embodiment of the present invention.

FIG. 2 is a circuit diagram, partly in block, showing a configuration of a receiver according to an embodiment of the present invention.

The receiver 100 of the embodiment includes a receiving portion 110 to which an RF signal is inputted, and a demodulating portion 120.

The receiving portion 110 includes a low-noise amplifier 111, a strain compensator 112, a local oscillator 113, a mixer 114 serving as a frequency converting section, an IF filter 115, an IF variable gain amplifier 116, and a strain compensation amount controlling section 117.

The low-noise amplifier 111 amplifies the RF signal having a frequency of, for example, 46 to 886 MHz, and received at an antenna (not shown) with a predetermined gain, and outputs the RF signal thus amplified to the mixer 114.

The gain of the low-noise amplifier 111 is adjusted to an optimal value in accordance with a gain control signal SGC supplied from the demodulating portion 120.

The low-noise amplifier 111 is disposed in a first stage of the receiving portion 110. Thus, in particular, an amplifier having an excellent S/N ratio, that is, a low-noise amplifier having a low-noise factor (NF) is used as the low-noise amplifier 111 for the purpose of ensuring an acoustic quality, an image quality and the like even when a level of an input signal is low.

The strain compensator 112 has a function of compensating for a third-order strain generated in an output current from the low-noise amplifier 111 by subtracting a compensation current (strain compensation amount) controlled in accordance with a bias signal S117 supplied from the strain compensation amount controlling section 117 from the output current from the low-noise amplifier 111.

The receiver 100 of the embodiment has a function of changing a strain compensation amount of the low-noise amplifier 111 for which the strain compensation is carried out in accordance with a strength of the received signal, thereby making it possible to ensure a wider dynamic range of the receiver 100.

In addition, the wireless communication apparatus (receiver) 100 of the embodiment have a function of causing the compensation amount corresponding to the strength of the received signal to be variable, thereby making it possible to optimize the dynamic range corresponding to a reception environment.

It is noted that the concrete configurations and functions of the low-noise-amplifier 111, the strain compensator 112, and the strain compensation amount controlling section 117 which are used to realize the function described above will be described later in detail.

The local oscillator 113 generates a local oscillation signal SLO corresponding to an oscillation signal having a predetermined frequency and sent from a PLL circuit (not shown), and supplies the local oscillation signal SLO thus generated to the mixer 114.

The mixer 114 derives a frequency difference between the received RF signal supplied from the low-noise amplifier 111, and the local oscillation signal SLO supplied from the local oscillator 113, converts the frequency difference thus derived into a base band through the frequency conversion, generates an intermediate frequency (IF) signal, and outputs the IF signal thus generated to the IF filter 115.

The IF filter 115 attenuates any of signals having frequency bands other than a frequency band of the IF signal from the IF signal, reduces any of noises contained in the IF signal, and outputs the resulting analog base-band signal to the IF variable gain amplifier 116.

The IF variable gain amplifier 116 amplifiers the analog base-band signal inputted thereto with a gain corresponding to the gain control signal SGC generated in the demodulating portion 120, and outputs the analog base-band signal thus amplified to the demodulating portion 120.

The demodulating portion 120 executes digital signal processing for a base-band signal, thereby converting the analog base-band signal S110 outputted from the receiving portion 110 into a digital signal, and outputs the resulting digital signal as a video/audio signal to a signal processing system in a stage next to the demodulating portion 120.

The modulating portion 120 has a function of detecting a level of an electric power of the received signal based on the base-band signal converted into the digital signal based on the analog base-band signal S110 outputted from the receiving portion 110.

The modulating portion 120 outputs the gain control signal SGC in accordance with which the variable gain of the IF variable gain amplifier 116 is controlled in the form of the analog signal to the receiving portion 110 based on the result of the detection of the level of the electric power of the received signal.

The gain control signal SGC inputted to the receiving portion 110 is then inputted to each of the low-noise amplifier 111, the IF variable gain amplifier 116, and the strain compensation amount controlling section 117.

2. Concrete Configuration of Strain Compensation System

As has been described, with the wireless communication system (receiver) 100 of the embodiment, the strain compensation amount of the low-noise amplifier 111 for which the strain compensation is carried out is changed in accordance with the strength of the received signal, thereby making it possible to enhance the dynamic range of the receiver 100.

The concrete configurations and functions of the low-noise amplifier 111, the strain compensator 112, and the strain compensation amount controlling section 117 which are used to mainly realize the function described above will be described in detail hereinafter.

With the receiver 100, when the level of the electric power of the received signal is detected as being low, the low-noise factor is required for the receiving portion 110. On the other hand, when the level of the electric power of the received signal is detected as being high, the high linearity is required for the receiving portion 110.

In addition, the gain of the receiving portion 110 shown in FIG. 2 is controlled in accordance with the gain control signal (voltage signal) SGC outputted from the demodulating portion 120 so as to become the suitable value in accordance with the strength of the received signal.

Therefore, the strength of the received signal can be discriminated in accordance with the voltage of the gain control signal SGC.

Figure 3:
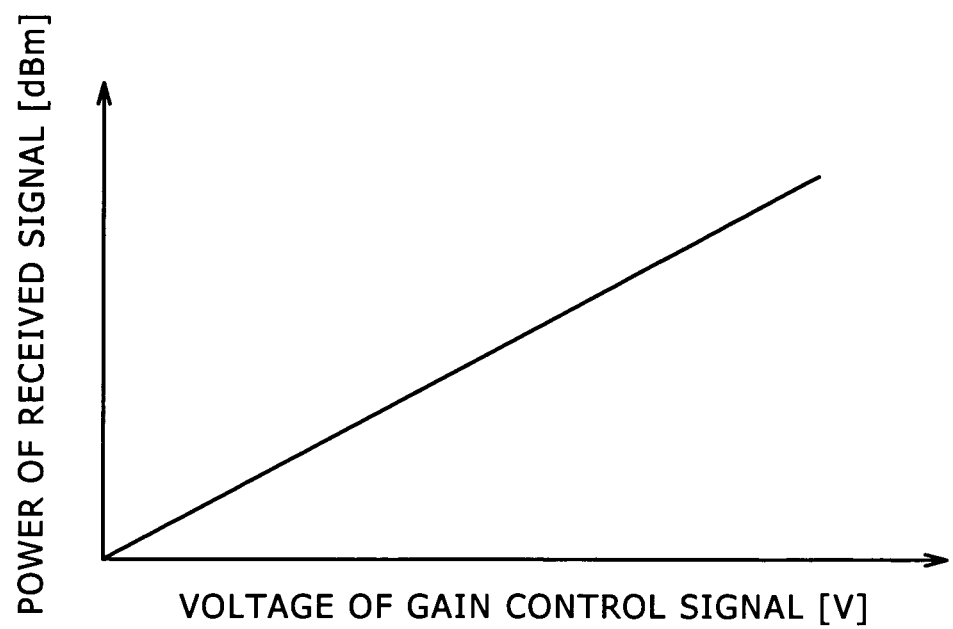
FIG. 3 is a graphical representation showing a relationship between a voltage of a gain control signal, and an electric power of a received signal.

FIG. 3 is a graphical representation showing a relationship between the voltage of the gain control signal, and the electric power of the received signal.

In FIG. 3, an axis of abscissa represents the voltage of the gain control signal SGC, and an axis of ordinate represents the electric power of the received signal.

In the receiver 100 of the embodiment, the strain compensation amount is controlled by using the voltage of the gain control signal SGC as a judgment reference for the strength of the received signal in accordance with the relationship, shown in FIG. 3, between the voltage of the gain control signal SGC, and the electric power of the received signal.

The concrete configurations and functions of the low-noise amplifier 111, the strain compensator 112, and the strain compensation amount controlling section 117 will be described in detail hereinafter with reference to FIG. 4.

Figure 4:
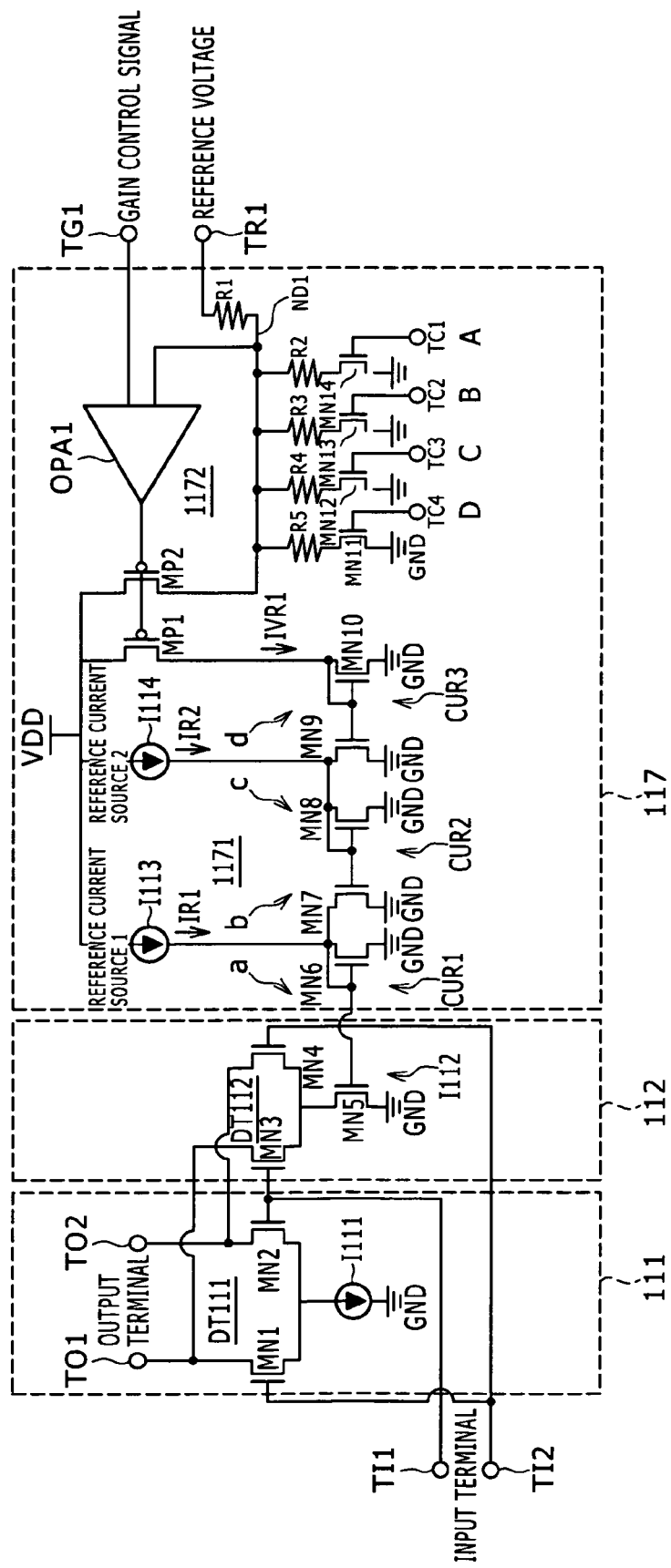
FIG. 4 is a circuit diagram showing concrete configurations of a low-noise amplifier, a strain compensator, and a strain compensation amount controlling portion which compose a receiving portion of the receiver according to the embodiment of the present invention.

FIG. 4 is a circuit diagram showing concrete configurations of the low-noise amplifier, the strain compensator, and the strain compensation amount controlling portion which compose the receiving portion of the receiver of the embodiment.

The low-noise amplifier 111 shown in FIG. 4 includes NMOS transistors MN1 and MN2 composing a first differential pair transistor DT111, and a current source I111.

The NMOS transistor MN1 corresponds to a first transistor, and the NMOS transistor MN2 corresponds to a second transistor.

It is noted that in FIG. 4, reference symbols IT1 and IT2 designate input terminals, respectively, and reference symbols TO1 and TO2 designate output terminals, respectively.

A source terminal of the NMOS transistor MN1, and a source terminal of the NMOS transistor MN2 are connected to each other, thereby composing the first differential pair transistor DT111.

A connection point between the source terminals of the NMOS transistors MN1 and MN2 is connected to one terminal of the current source I111, and the other terminal of the current source I111 is connected to a reference electric potential, for example, a ground GND.

A gate terminal of the NMOS transistor MN1 is connected to the input terminal TI2, and a gate terminal of the NMOS transistor NM2 is connected to the input terminal TI1.

A first input terminal of the low-noise amplifier 111 is formed by the gate terminal of the NMOS transistor NM1, and a second input terminal of the low-noise amplifier 111 is formed by the gate terminal of the NMOS transistor NM2.

A drain terminal of the NMOS transistor MN1 is connected to the output terminal TO1 and a drain terminal of the NMOS transistor MN2 is connected to the output terminal TO2.

A first output terminal of the low-noise amplifier 111 is formed by the drain terminal of the NMOS transistor MN1, and a second output terminal of the low-noise amplifier 111 is formed by the drain terminal of the NMOS transistor MN2.

The strain compensator 112 includes NMOS transistors MN3 and MN4 composing a second differential pair transistor DT112, and an NMOS transistor MN5 composing a current source I112.

The MNOS transistor MN3 corresponds to a third transistor, the NMOS transistor MN4 corresponds to a fourth transistor, and the NMOS transistor MN5 corresponds to a fifth transistor. Also, a gate terminal of the NMOS transistor MN5 corresponds to a control terminal.

A source terminal of the NMOS transistor MN3, and a source terminal of the NMOS transistor MN4 are connected to each other, thereby composing a second differential pair transistor DT112.

A connection point between the source terminals of the NMOS transistors MN3 and MN4 is connected to a drain terminal of the NMOS transistor MN5 composing the current source I111. Also, the source terminal of the NMOS transistor MN5 is connected to the reference electric potential, for example, the ground GND.

A gate terminal of the NMOS transistor MN3 is connected to the input terminal TI1, and a gate terminal of the NMOS transistor MN4 is connected to the input terminal TI2.

A first input terminal of the strain compensator 112 is formed by the gate terminal of the NMOS transistor NM3, and a second input terminal of the strain compensator 112 is formed by the gate terminal of the NMOS transistor NM4.

A drain terminal of the NMOS transistor NM3 is connected to the output terminal TO1, and a drain terminal of the NMOS transistor MN4 is connected to the output terminal TO2.

A first output terminal of the strain compensator 112 is formed by the drain terminal of the NMOS transistor MN3, and a second output terminal of the strain compensator 112 is formed by the drain terminal of the NMOS transistor MN4.

Also, a gate terminal (control terminal) of the NMOS transistor NM5 composing the current source I112 is connected to a supply line through which the bias signal S117 is supplied from the strain compensation amount controlling section 117 to the strain compensator 112.

As previously stated, the strain compensator 112 compensates for the third-order strain generated in the output current from the low-noise amplifier 111 by subtracting the compensation current (strain compensation amount) controlled in accordance with the bias signal S117 supplied from the strain compensation amount controlling section 117 from the output current from the low-noise amplifier 111.

Specifically, in the strain compensator 112, a level at the gate terminal of the NMOS transistor NM5 serving as the current source I112 is controlled in accordance with the bias signal S117, so that an amount of current is controlled.

The strain compensation amount controlling section 117 includes first and second reference current sources I113 and I114, NMOS transistors MN6 to MN14, p-channel MOS (PMOS) transistors MP1 and MP2, resistors R1 to R5, and an operational amplifier OPA1.

Also, a compensation amount controlling circuit 1171 is composed of the reference current sources I113 and I114, the NMOS transistors MN6 to MN10, and the PMOS transistor MP1.

In addition, the received signal strength judging portion 1172 is composed of the NMOS transistors MN11 to MN14, the PMOS transistor MP2, the resistors R1 to R5, and the operational amplifier OPA1.

Referring to FIG. 4, reference symbol TG1 designates an input terminal for the gain control signal SGC, and reference symbol TR1 designates an input terminal for a reference voltage Vref. Also, reference symbol TC1 designates an input terminal for a control signal A, reference symbol TC2 designates an input terminal for a control signal B, reference symbol TC3 designates an input terminal for a control signal C, and reference symbol TC4 designates an input terminal for a control signal D.

The constituent elements of the compensation amount controlling circuit 1171 are disposed to be connected in the manner as will be described later.

Each of one terminal of the reference current source I113 and one terminal of the reference current source I114 is connected to a power source VDD.

Each of a drain terminal and a gate terminal of the NMOS transistor MN6 is connected to the other terminal of the reference current source I113, and a connection point between the drain terminal and the gate terminal of the NMOS transistor MN6 is connected to the gate terminal of the NMOS transistor MN5 composing the current source I112 of the strain compensator 112. A source terminal of the NMOS transistor MN5 is connected to the ground GND as the reference electric potential.

Also, a current mirror circuit CUR1 is composed of the NMOS transistor MN6 and the NMOS transistor MN5.

A drain terminal of the NMOS transistor MN7 is connected to a connection point among the other terminal of the first reference current source I113, and the drain terminal and the gate terminal of the NMOS transistor MN6. Also, a source terminal of the NMOS transistor MN7 is connected to the ground GND.

A gate terminal of the NMOS transistor MN7 is connected to each of a gate terminal and a drain terminal of the NMOS transistor MN8. Each of a gate terminal and a drain terminal of the NMOS transistor MN8 is connected to the other terminal of the second reference current source I114. Also, a source terminal of the NMOS transistor MN8 is connected to the ground GND.

A current mirror circuit CUR2 is composed of the NMOS transistor MN7 and the NMOS transistor MN8.

A drain terminal of the NMOS transistor MN9 is connected to a connection point among the other terminal of the second reference current source I114, and a drain terminal and a gate terminal of the NMOS transistor MN8. Also, a source of the NMOS transistor MN9 is connected to the ground GND.

A gate terminal of the NMOS transistor MN9 is connected to each of a gate terminal and a drain terminal of the NMOS transistor MN10. Each of the gate terminal and the drain terminal of the MNOS transistor MN10 is connected to a drain terminal of the PMOS transistor MP1 functioning as a current source. Also, a source terminal of the NMOS transistor MN10 is connected to the ground GND. A source terminal of the PMOS transistor MP1 is connected to the power source VDD.

A current mirror circuit CUR5 is composed of the NMOS transistor MN9 and the NMOS transistor MN10.

In the compensation amount controlling circuit 1171, a first reference current IR1 from the first reference current source I113 is caused to divergingly flow through a path, a, on the side of the current mirror circuit CUR1, and a path, b, on the side of the current mirror circuit CUR2.

Also, when an amount of current from the current mirror circuit CUR2 on the path, b, side is decreased, an amount of current from the current mirror circuit CUR1 on the path, a, side is increased.

On the other hand, when the amount of current from the current mirror circuit CUR2 on the path, b, side is increased, the amount of current from the current mirror circuit CUR1 on the path, a, side is decreased.

A second reference current IR2 from the second reference current source I114 is caused to divergingly flow through a path, c, on the side of the current mirror circuit CUR2, and a path, d, on the side of the current mirror circuit CUR3.

Also, when an amount of current from the current mirror circuit CUR3 on the path, d, side is decreased, an amount of current from the current mirror circuit CUR2 on the path, c, side is increased.

On the other hand, when the amount of current from the current mirror circuit CUR3 on the path, d, side is increased, the amount of current from the current mirror circuit CUR2 on the path, c, side is decreased.

In addition, an amount of current from the PMOS transistor MP1 composing the current source to the current mirror circuit CUR3 is increased or decreased in accordance with an output from the operational amplifier OPA1.

The constituent elements of the received signal strength judging portion 1172 are disposed to be connected in the manner which will be described below.

An inverting input terminal (−) of the operational amplifier OPA1 is connected to the input terminal TG1 for the gain control signal SGC, and a non-inverting input terminal (+) of the operational amplifier OPA1 is connected to one terminal of the resistor R1. Also, a node ND1 is formed by a connection point between the non-inverting input terminal (+) of the operational amplifier OPA1, and one terminal of the resistor R1.

The other terminal of the resistor R1 is connected to the input terminal TR1 of the reference voltage Vref.

An output terminal of the operational amplifier OPA1 is connected to each of the gates of the PMOS transistors MP1 and MP2.

A source terminal of the PMOS transistor MP2 is connected to the power source VDD, and a drain terminal of the PMOS transistor MP2 is connected to the node ND1. The PMOS transistor MP2 causes a current IVR2 (=IVR1) corresponding to a level of an output signal from the operational amplifier OPA1 to flow through the node ND1 side.

One terminal of the resistor R2 is connected to the node ND1, and the other terminal of the resistor R2 is connected to a drain terminal of the NMOS transistor MN14 serving as a switch. A source terminal of the NMOS transistor MN14 is connected to the ground GND, and a gate terminal of the NMOS transistor MN14 is connected to the input terminal TC1 for the control signal A.

One terminal of the resistor R3 is connected to the node ND1, and the other terminal of the resistor R3 is connected to a drain terminal of the NMOS transistor MN13 serving as a switch. A source terminal of the NMOS transistor MN13 is connected to the ground GND, and a gate terminal of the NMOS transistor MN13 is connected to the input terminal TC2 for the control signal B.

One terminal of the resistor R4 is connected to the node ND1, and the other terminal of the resistor R4 is connected to a drain terminal of the NMOS transistor MN12 serving as a switch. A source terminal of the NMOS transistor MN12 is connected to the ground GND, and a gate terminal of the NMOS transistor MN12 is connected to the input terminal TC3 for the control signal C.

One terminal of the resistor R5 is connected to the node ND1, and the other terminal of the resistor R5 is connected to a drain terminal of the NMOS transistor MN11 serving as a switch. A source terminal of the NMOS transistor MN11 is connected to the ground GND, and a gate terminal of the NMOS transistor MN11 is connected to the input terminal TC4 for the control signal D.

In the receiver 100 of the embodiment, resistance values of the resistors R2, R3, R4, and R5 are set as different values, respectively.

In addition, any one of the control signals A, B, C, and D is set at a High level (H), for example, in accordance with a specification.

Also, any one of the NMOS transistors MN11 to MN14 is turned ON in accordance with any one, of the control signals A, B, C, and D, set at the High level. The reference voltage Vref is divided by any one of the resistors R2, R3, R4, and R5 having the other terminals connected to the drain terminals of the NMOS transistors MN14, MN13, MN12, and MN11 any one of which is turned ON, and the resulting voltage obtained through the voltage division is inputted to the non-inverting input terminal (+) of the operational amplifier OPA1.

Next, an operation of the circuit including the low-noise amplifier 111, the strain compensator 112, and the strain compensation amount controlling section 117 configured in the manner described above will focus on the operation of the strain compensation amount controlling section 117.

Figure 5:
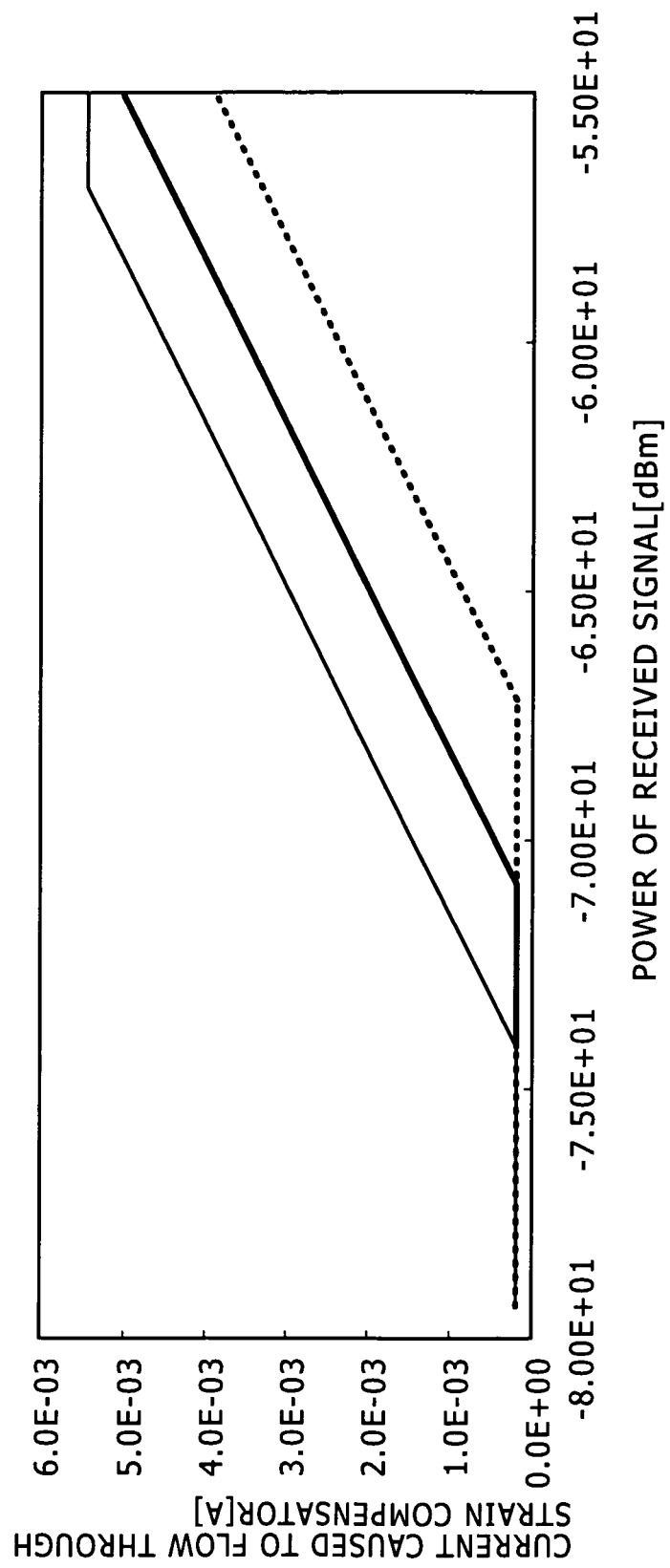
FIG. 5 is a graph showing dependency of a current caused to flow through the strain compensator on the electric power of the received signal.

It is noted that FIG. 5 is a graph showing dependency of the current caused to flow through the strain compensator on the electric power of the received signal.

In FIG. 5, an axis of abscissa represents the electric power of the received signal, and an axis of ordinate represents the current caused to flow through the strain compensator 112.

The gain control signal SGC inputted to the inverting input terminal (−) of the operational amplifier OPA1 is compared with the voltage which is obtained by dividing the reference voltage Vref at the voltage division ratio of the resistance voltage divider composed of a group of resistors R1, and R2 to R5, and which is developed at the node ND1.

When the gain control signal SGC is larger than the voltage-divided reference voltage, a current IVR1 which is proportional to the gain control signal SGC is caused to flow through each of the PMOS transistors MP1 and MP2.

The current IVR1 is subtracted from the second reference current IR2 from the first reference current source I114 by both the NMOS transistors MN10 and MN9.

In addition, the second reference current obtained through the subtraction is subtracted from the first reference current IR1 from the first reference current source I113 by both the NMOS transistors MN7 and MN8.

As a result, the current shown in the graph of FIG. 5 is caused to flow through the strain compensator 112 so as to correspond to the strength of the received signal.

For example, when the current caused to flow through the PMOS transistor MP1 is increased in accordance with the result of the comparison made in the operational amplifier OPA1, the current caused to flow through the path, d, is decreased, while the current caused to flow through the current mirror circuit CUR2 via the path, c, is increased.

As a result, the current caused to flow through the path, b, is decreased, while the current caused to flow through the current mirror circuit CUR1 via path, a, is increased.

On the other hand, when the current caused to flow through the PMOS transistor MP1 is decreased in accordance with the result of the comparison made in the operational amplifier OPA1, the current caused to flow through the path d is increased, while the current caused to flow through the current mirror circuit CUR2 via the path, c, is decreased.

As a result, the current caused to flow through the path, b, is increased, while the current caused to flow through the current mirror circuit CUR1 via the path, a, is decreased.

In addition, the control signals A to D are signals each set at a CMOS level, and have a part for changing the voltage division ratio of the resistance voltage divider composed of the resistor R1, and the resistors R2 to R5 in addition to the operation described above.

As a result, for example, the dependency of the strain compensation amount on the input electric power can be made to have a suitable value depending on modulation formats which are different in desired CN from one another.

Figure 6:
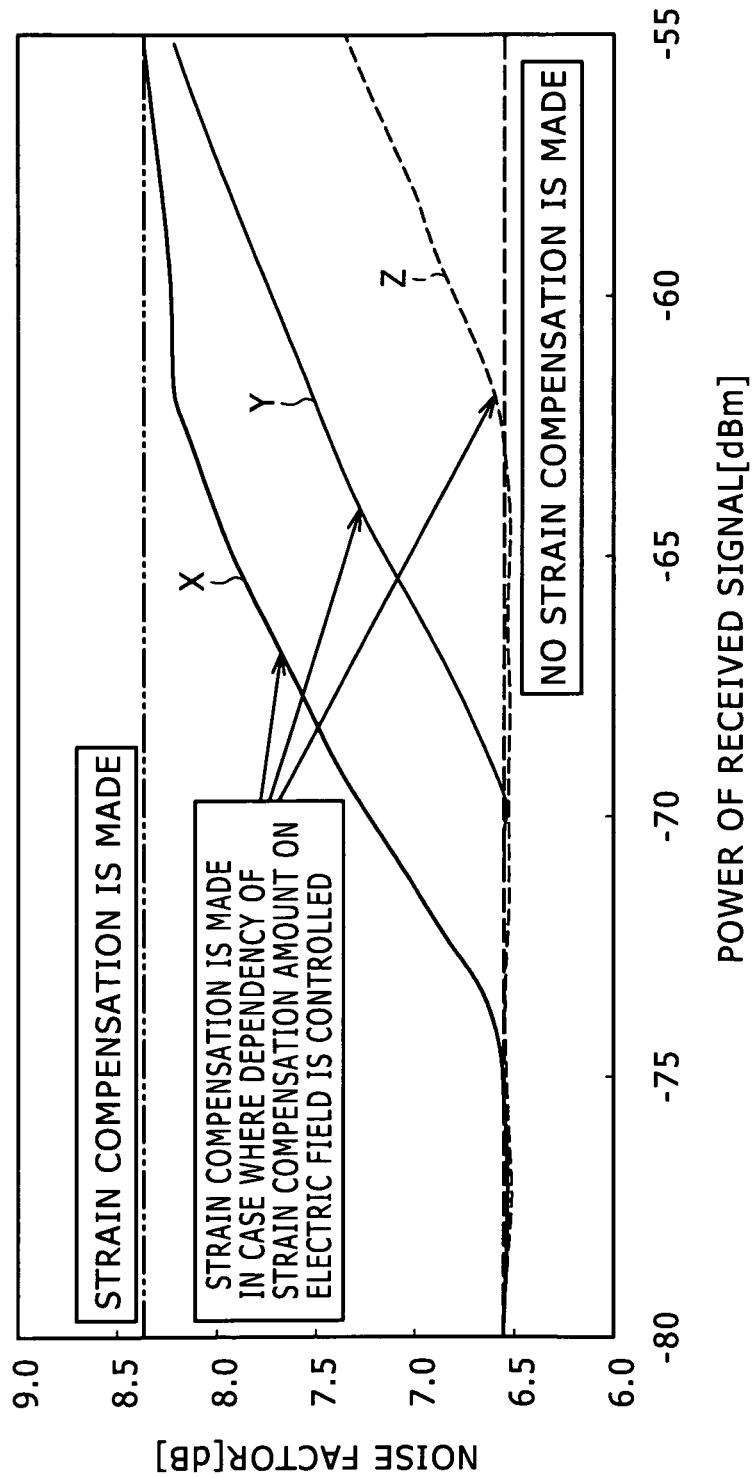
FIG. 6 is a graph showing dependency of a noise factor on the electric power of the received signal.

FIG. 6 is a graph showing dependency of the noise factor on the electric power of the received signal.

In FIG. 6, an axis of abscissa represents the electric power of the received signal, and an axis of ordinate represents the noise factor.

In addition, in FIG. 6, curves indicated by X, Y and Z, respectively, correspond to the case where the strain compensation is carried out, and show the characteristics in the case where the dependency of the strain compensation amount on the electric field is controlled.

When the current caused to flow through the strain compensator 112 is reduced, the gain of the circuit is increased, and as shown in FIG. 6, the noise factor characteristics are enhanced along with the reduction of the strength of the received signal.

In addition, it is understood from the graph of FIG. 6 that the level of the input signal at which the noise factor begins to be enhanced with the mechanism described above is changed by changing the dependency of the strain compensation amount on the electric power of the input signal.

It is noted that although the strain compensation amount is reduced along with the reduction of the strength of the received signal, the strain compensation itself is simultaneously reduced because the strength of the received signal is reduced. Therefore, the signal quality is not impaired because of the contribution by the enhancement of the noise factor.

Figure 7:
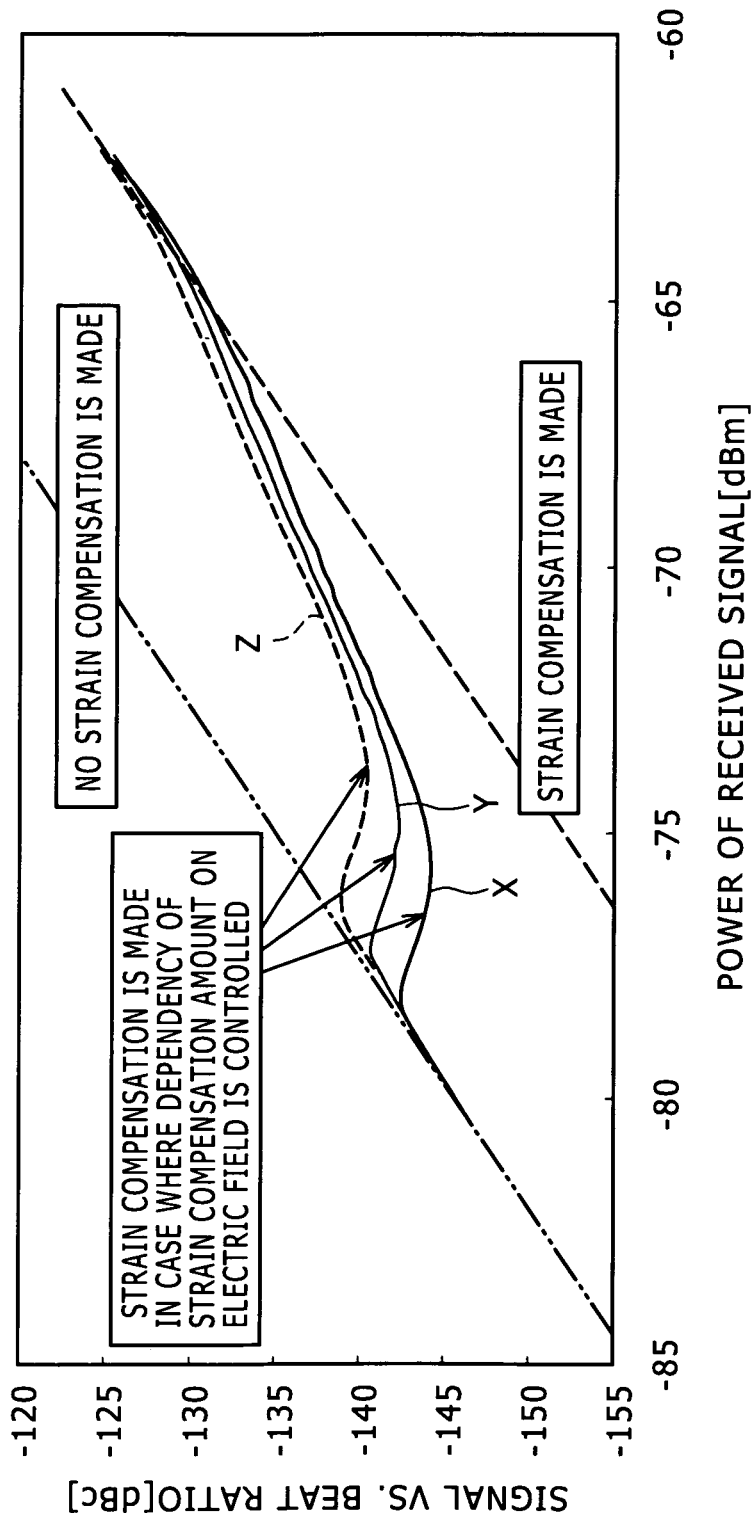
FIG. 7 is a graph showing a signal vs. a beat ratio when a ratio of an electric power of a desired wave to an electric power of an interfering wave is made constant.

FIG. 7 is a graph showing a signal vs. a beat ratio when a ratio of the electric power of the desired wave to the electric power of the interfering wave is made constant.

In FIG. 7, an axis of abscissa represents the electric power of the received signal, and an axis of ordinate represents the signal vs. the beat ratio.

In addition, in FIG. 7, curves indicated by X, Y and Z, respectively, correspond to the case where the strain compensation is carried out, and show the characteristics in the case where the dependency of the strain compensation amount on the electric field is controlled.

It is understood from the graph of FIG. 7 that similarly to the case of the noise factor characteristics, the level of the input signal at which the signal vs. the beat ratio begins to be enhanced with the mechanism described above is changed by changing the dependency of the strain compensation amount on the electric power of the input signal.

FIGS. 8A to 8C are respectively schematic views explaining an effect when the present invention is applied to the case where a television broadcast wave is received at the receiver shown in FIG. 2.

Also, FIGS. 8A to 8C show an example when a television broadcast wave is received at the receiver 100.

In FIGS. 8A to 8C, an area ARA1 is an area in which the strength of the received signal is high because the receiver 100 is located close to a broadcasting tower 200 for TV.

In addition, an area ARA2 is an area in which the strength of the received signal is low because the receiver 100 is located away from the broadcasting tower 200 for TV.

Also, FIG. 8A shows a display state of an image in a television set 210 when the television set 210 has no strain compensating function.

FIG. 8B shows a display state of an image in the television set 210 when the television set 210 has a strain compensating function.

FIG. 8C shows a display state of an image in the television set 210 when the television set 210 has the strain compensating and signal strength judging function as with the embodiment.

When the television set 210 has no strain compensating function, as shown in FIG. 8A, an image is not displayed in the television set 210 in the area ARA1 as the area in which the television set 210 is located close to the broadcasting tower 200 and thus the strength of the received signal is high (the broadcasting state is not good).

An image is displayed on the screen of the television set 210 in the area ARA2 as the area in which the television set 210 is located away from the broadcasting tower 200 and thus the strength of the received signal is low.

When the television set 210 has the strain compensating function, as shown in FIG. 8B, an image is displayed on the screen of the television set 210 in the area ARA1 as the area in which the television set 210 is located close to the broadcasting tower 200 and thus the strength of the received signal is high.

On the other hand, an image is not displayed in the television set 210 in the area ARA2 as the area in which the television set 210 is located away from the broadcasting tower 200 and thus the strength of the received signal is low.

When the television set 210 has the strain compensating and signal strength judging function, as shown in FIG. 8C, an image is displayed on the screen of the television set 210 in the area ARA1 as the area in which the television set 210 is located close to the broadcasting tower 200 and thus the strength of the received signal is high.

In addition, an image is displayed on the screen of the television set 210 as well in the area ARA2 as the area in which the television set 210 is located away from the broadcasting tower 200 and thus the strength of the received signal is low.

As set forth hereinabove, according to the embodiment, the strain compensating technology is applied to the receiver, and the strain compensation amount is compared with the gain control voltage in order to carry out the desired control.

The gain control voltage is proportional to the strength of the received signal. Thus, when the strength of the received signal is low, the noise factor characteristics are improved, while when the strength of the received signal is high, the strain characteristics are improved.

As a result, it is possible to enhance the dynamic range of the receiver.

The present application contains subject matter related to that disclosed in Japanese Priority Patent Application JP 2009-131849 filed in the Japan Patent Office on Jun. 1, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A receiver, comprising:
    an amplifier for amplifying a received signal;
    a strain compensator for compensating for a strain generated in an output signal from the amplifier in accordance with a strain compensation amount which is controlled based on a bias signal;
    a strain compensation amount controlling portion for generating the bias signal and outputting the bias signal to the strain compensator so that the strain compensation is carried out with the strain compensation amount proportional to the bias signal, wherein the bias signal is proportional to a strength of the received signal; and
    a demodulating portion for detecting the strength of the received signal, generating a gain control signal in accordance with which an amplification gain of the amplifier is controlled in accordance with the strength of the received signal, and supplying the gain control signal to the strain compensation amount controlling portion, wherein the strain compensation amount controlling portion comprises:
        a first reference current source for supplying a first reference current,
        a second reference current source for supplying a second reference current,
        a current proportional to the gain control signal being subtracted from the second reference current, the second reference current thus subtracted being subtracted from the first reference current, and a current corresponding to the first reference current thus subtracted being supplied as the bias signal to the strain compensator, and
    a current corresponding to the strength of the received signal is caused to flow through the strain compensator.

2. The receiver according to claim 1,
    wherein the strain compensation amount controlling portion compares a level of the gain control signal and a level of a signal corresponding to a reference voltage previously set, generates the bias signal so as to carry out the strain compensation with the strain compensation amount proportional to the strength of the received signal when the level of the gain control signal is higher than that of the level of the signal corresponding to the reference voltage, and outputs the bias signal to the strain compensator.

3. The receiver according to claim 1, further comprising:
    a frequency converting portion for frequency-converting the received signal amplified by the amplifier in accordance with a local oscillation signal; and
    a variable gain amplifier for adjusting the frequency-converted received signal with a gain corresponding to the gain control signal,
    wherein the demodulating portion is for supplying the gain control signal to at least the variable gain amplifier and the strain compensation amount controlling portion and
    wherein the strain compensation amount controlling portion compares a level of the gain control signal and a level of a signal corresponding to a reference voltage previously set, generates the bias signal so as to carry out the strain compensation with the strain compensation amount proportional to the strength of the received signal when the level of the gain control signal is higher than that of the level of the signal corresponding to the reference voltage, and outputs the bias signal to the strain compensator.

4. The receiver according to claim 3, wherein when the level of the gain control signal is higher than that of the level of the signal corresponding to the reference signal, the strain compensation amount controlling portion generates the current proportional to the gain control signal, and generates the bias signal in accordance with the current thus generated.

5. The receiver according to claim 4, wherein the strain compensation amount controlling portion causes the level of the signal corresponding to the reference signal to be variable.

6. The receiver according to claim 1, wherein the strain compensator compensates a third-order strain generated in the output signal from the amplifier by subtracting the strain compensation amount which is proportional to the bias signal.

7. The receiver according to claim 1, wherein the strain compensation amount controlling portion comprises a received signal strength judging portion which compares a level of the gain control signal and a level of a signal corresponding to a reference voltage previously set.

8. The receiver according to claim 7, where the level of the signal corresponding to the reference voltage is controlled by one or more control signals.

9. A receiver, comprising:
    an amplifier for amplifying a received signal;
    a strain compensator for having a function of compensating for a strain generated in an output signal from the amplifier in accordance with a strain compensation amount which is controlled based on a bias signal;

a strain compensation amount controlling portion for generating the bias signal and outputting the bias signal to the strain compensator so that the strain compensation is carried out with the strain compensation amount corresponding to a strength of the received signal; and a demodulating portion for detecting a level of the received signal, generating a gain control signal in accordance with which an amplification gain of the amplifier is controlled in accordance with the level of the received signal, and supplying the gain control signal to at least the strain compensation amount controlling portion;

wherein the strain compensation amount controlling portion compares the level of the gain control signal and a signal corresponding to a reference voltage previously set, generates the bias signal so as to carry out the strain compensation with the strain compensation amount corresponding to the strength of the received signal when the level of the gain control signal is higher than that of the signal corresponding to the reference voltage, and outputs the bias signal to the strain compensator;

wherein when the level of the gain control signal is higher than that of the signal corresponding to the reference signal, the strain compensation amount controlling portion generates a current proportional to the gain control signal, and generates the bias signal in accordance with the current thus generated and wherein said strain compensation amount controlling portion comprises:

a first reference current source for supplying a first reference current; and a second reference current source for supplying a second reference current;

the current proportional to the gain control signal being subtracted from the second reference current, the second reference current thus subtracted being subtracted from the first reference current, and a current corresponding to the first reference current thus subtracted being supplied as the bias signal to said strain compensator; and a current corresponding to the strength of the received signal is caused to flow through said strain compensator.

10. A receiver, comprising:

an amplifier for amplifying a received signal;

a strain compensator for having a function of compensating for a strain generated in an output signal from the amplifier in accordance with a strain compensation amount which is controlled based on a bias signal; and a strain compensation amount controlling portion for generating the bias signal and outputting the bias signal to the strain compensator so that the strain compensation is carried out with the strain compensation amount corresponding to a strength of the received signal, wherein said amplifier comprises:

a first differential pair transistor composed of a first transistor and a second transistor; and a current source connected to said first differential pair transistor; and wherein said strain compensator comprises:

a second differential pair transistor composed of a third transistor and a fourth transistor; and a fifth transistor connected to said second differential pair transistor, and serving as a current source having a control terminal to which the bias signal is supplied;

a common first input signal being supplied to each of control terminals of said first transistor and said fourth transistor;

a common second input signal being supplied to each of said second transistor and said third transistor;

an output terminal of said first transistor, and an output terminal of said third transistor being connected to each other; and an output terminal of said second transistor, and an output terminal of said fourth transistor being connected to each other.

* * * * *